Jan. 17, 1967 R. F. WOOD 3,299,358
REMOTE CONTROL RECEIVER WITH A DETECTOR RESPONSIVE
ONLY TO UNMODULATED CARRIER WAVE
Filed Jan. 23, 1963 2 Sheets-Sheet 1
FIG. 1. PURE CARRIER DETECTOR
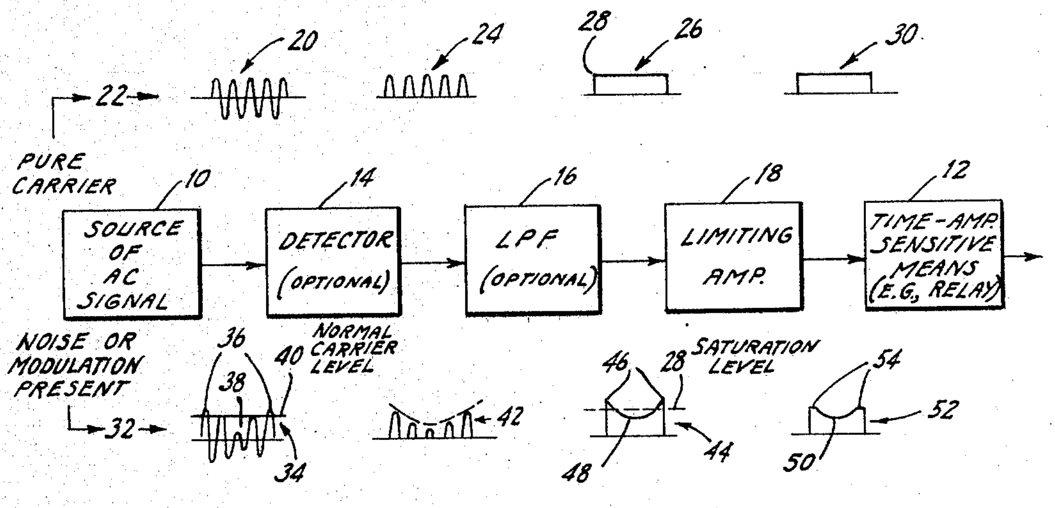
FIG. 2. PURE CARRIER DETECTOR WITH INCREASED SENSITIVITY
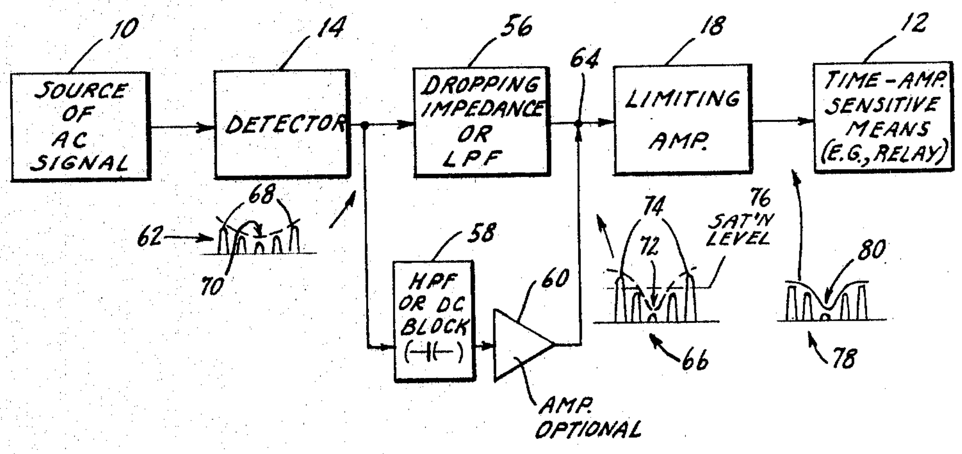
INVENTOR.
RICHARD F. WOOD
BY Robert D. Sanborn
ATTORNEY Jan. 17, 1967 R. F. WOOD 3,299,358
REMOTE CONTROL RECEIVER WITH A DETECTOR RESPONSIVE ONLY TO UNMODULATED CARRIER WAVE
Filed Jan. 23, 1963 2 Sheets-Sheet 2
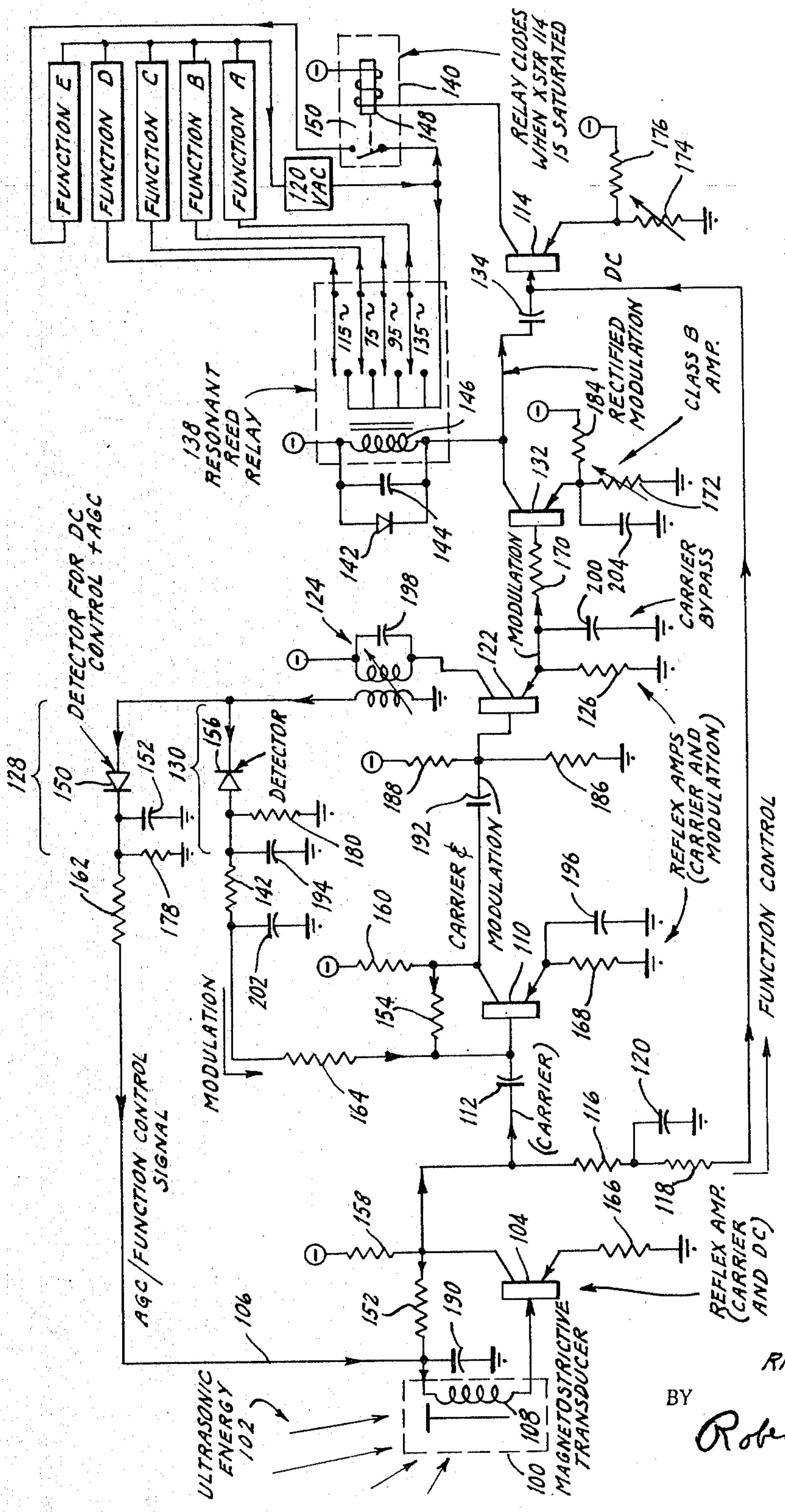
FIG. 3. ULTRASONIC 5 CHANNEL AM/PURE CARRIER REMOTE CONTROL RECEIVER
INVENTOR.
RICHARD F. WOOD
BY Robert D. Sanborn
ATTORNEY United States Patent Office 3,299,358

Patented Jan. 17, 1967

3,299,358

REMOTE CONTROL RECEIVER WITH A DETECTOR RESPONSIVE ONLY TO UNMODULATED CARRIER WAVE

Richard F. Wood, Marlton, N.J., assignor to Philco-Ford Corporation, a corporation of Delaware Filed Jan. 23, 1963, Ser. No. 253,337
5 Claims. (Cl. 325—393)

This invention relates to a circuit which is capable of detecting a pure or unmodulated carrier, and which will not respond to a carrier containing any form of amplitude modulation, including noise. Two principal areas of utility for such a circuit are found: one wherein it is desirable to provide an indication of the presence per se of a carrier without amplitude modulation (pure carrier detector), and another wherein a noise immunity circuit is desired.

Several practical applications for the circuit of the invention are found when it is used as a pure carrier detector. One occurs in connection wtih AM broadcasting when it is advantageous to know whether a carrier is being transmitted, yet it is impractical to modulate the carrier. Another instance occurs in connection with AM remote control receivers wherein particular functions may be selected according to the frequency of a tone which amplitude modulates a carrier. Utilization of the pure carrier detector to provide an indication of the presence of carrier alone provides an extra channel or function selector without requiring a separate modulating frequency and concomitant circuitry. Hence a reduction in over-all bandwidth requirement is obtained. Such a remote control circuit incorporating the pure carrier detector of the invention constitutes a practical embodiment of the invention, discussed below.

When the circuit of the invention is used as a noise immunity circuit it has particular utility in cases where the presence of amplitude modulation in the form of noise in a carrier would cause deleterious effects in the circuit to which the carrier is supplied. In function control circuits, for example, wherein a carrier containing some form of modulation other than amplitude modulation is made to initiate various functions, noise, when present in the carrier, may disrupt operation of the circuit or initiate certain functions when their occurrence is not desired. For instance, in an ultrasonic remote control receiver responsive to continuous wave (CW) signals, noises of a pulsating nature, such as key jingling, etc., frequently cause the receiver to malfunction. Utilization of a noise immunity circuit to disable the receiver when noise is present in the incoming carrier imparts a high degree of reliability thereto.

One type of noise immunity circuit heretofore used operates by accepting the noise frequencies through a filter, amplifying and detecting them, and using the resultant signal to turn off or disable a stage. Such circuits are responsive only to noise which differs in frequency from the signal, and not to noise whose frequency characteristics are the same as the signal but whose amplitude characteristics differ therefrom.

Another type of prior art noise immunity system which functions to remove noise from continuous wave type signals operates by strongly integrating the detected signal to dissipate the noise pulses. Integration, however, causes unwanted delays in the initiation of control functions, in addition to other drawbacks.

The noise immunity circuit of the present invention, although inherently simple and economical, instantly and reliably provides an indication when noise impulses or amplitude modulation is present in a received signal.

OBJECTS

The objects of the present invention are:

(1) to provide a circuit which provides an indication when a carrier signal without amplitude modulation is received,
(2) to provide a new and improved noise immunity circuit,
(3) to provide means for increasing the sensitivity of a noise immunity circuit,
(4) to provide a new and improved remote control circuit, and
(5) to provide an AM remote control circuit which is immune to noise and which responds to pure carrier to provide an additional control function. Other objects and advantages of the invention will become apparent from a consideration of the following description and the accompanying drawings.

SUMMARY

According to one embodiment of the present invention an unknown input signal is supplied to a first means which functions to substantially reproduce variations in said signal only up to a predetermined amplitude thereof. Second means are provided for responding when the output of the first means corresponds to said predetermined amplitude for a predetermined interval, thus indicating the presence of an unmodulated carrier.

DRAWINGS

The invention is exemplified in the several figures of drawing wherein:

FIG. 1 is a block diagram of the basic invention,

FIG. 2 is a block diagram of an embodiment of the invention having increased sensitivity, and FIG. 3 is a schematic diagram of a remote control circuit utilizing the principles of the invention to provide an extra control channel.

*FIG. 1*

DESCRIPTION

The basic pure carrier detector of the invention is depicted in FIG. 1 of the drawings. In FIG. 1 a source of A.C. signal 10 is to control the operation of time-amplitude sensitive means 12. The signal source 10 may be the output of an IF amplifier or an ultrasonic transducer. Source 10 may include an AGC circuit or degeneration to provide a constant average output signal level. The signal from source 10 is supplied to time-amplitude sensitive means 12 by way of detector 14, low pass filter (LPF) 16, and limiting amplifier 18.

Detector 14 and LPF 16 convert the alternating signal from source 10 to a D.C. signal. It is to be understood that the smoothing action of filter 16 may be provided in amplifier 18 or means 12. Further, detector 14 may be omitted provided means 12 is responsive to the average A.C. amplitude of the signal supplied by amplifier 18.

Detector 14 may be any non-linear device which will serve to rectify an alternating current signal. LPF 16 may comprise series inductors or shunt capacitors, or both, as well known to those skilled in the art.

Limiting amplifier 18 may take the form of a tube or transistor which saturates (i.e., produces no further output for increases in input) at the normal carrier level of the output of signal source 10.

The time-amplitude sensitive means 12 may be a relay which will not respond unless the current supplied thereto is above a certain pull-in value for a predetermined interval. In lieu of a relay, means 12 may be a purely electronic threshold circuit preceeded by an integrator which will perform the same function as a relay, i.e., provide no output unless than input exists at or above a predetermined level for a predetermined interval. Whether means 12 consists of a relay or a circuit, it must be selected so that its pull-in or threshold signal equals the output signal level from limiting amplifier 18 when the latter is saturated.

*FIG. 1*

PURE CARRIER OPERATION

Assume that the source of A.C. signal 10 supplies a pure carrier burst 20. (For this case the upper waveforms 22 illustrate the operation of the FIG. 1 system.) The detector 14 rectifies burst 20, yielding rectifier waveform 24. The LPF 16 smoothes waveform 24, yielding a D.C. pulse 26.

Limiting amplifier 18, to which pulse 26 is fed, is arranged so that it begins to saturate at the level 28 of waveform 26. Level 28 conforms to the normal or unmodulated level of carrier waveform 20. Thus the output signal level from limiting amplifier 18 will be a direct function of input signal level up to and including the level of waveform 26, but for greater input levels, the output of limiting amplifier 18 will be substantially constant and equal to its output when an input equal to the level 28 of waveform 26 is applied. As is well known, limiting amplifier 18 may be a passive (e.g., zener diode) circuit or an active element, such as a transistor or pentode which saturates at the level 28 of waveform 26. The actual output of limiting amplifier 18 will be waveform 30, which, although not necessarily the same height 28 as waveform 26, corresponds thereto and is substantially the maximum level output which limiting amplifier 18 can supply.

Waveform 30 is applied to time-amplitude sensitive means 12, which is arranged to provide an output if it receives an input signal equal to the level of waveform 30 for a predetermined interval. Such a device may comprise a relay whose resistance and pull-in current are such that the relay will provide an output (i.e., close) when a voltage equal to waveform 30 is applied thereto for a brief interval. As is well known, the relay may alternatively be designed to open when waveform 30 appears if a signal inverter is interposed between amplifier 18 and the relay. An electronic intergrator threshold circuit, as discussed, may also be used for means 12.

It is thus seen that means 12 provides an output when source 10 supplies a pure carrier waveform.

NOISE OR MODULATION OPERATION

Reference is now made to the lower waveforms 32 in FIG. 1, which illustrate the operation of the system when a carrier wave 34 which is noise or signal modulated is supplied by source 10.

Waveform 34 is illustrated as containing peaks 36 and a depression 38, which are respectively above and below normal carrier level 40. These excursions, as is well understood, may be caused by either noise pulses or signal amplitude modulation.

Detector 14 receifies waveform 34, so that waveform 42 appears at its output. Waveform 42 is smoothed in LPF 16, yielding wave 44 which is a D.C. pulse containing an A.C. component corresponding to the amplitude modulation envelope of waveform 34. The portions 46 and 48 of waveform 44 are respectively above and below level 28, which is equal to the saturation level of limiting amplifier 18.

Limiting amplifier 18 faithfully reproduces the portion 48 of waveform 44 as portion 50 of waveform 52, but portions 46 are clipped, leaving flat portions 54 in waveform 52.

The decreased amplitude portion 50 causes the average energy content of waveform 52 to be insufficient to actuate the time-amplitude sensitive means 12. That is, although portions 54 of waveform 52 are equal to the *level* required to actuate means 12, neither portion persists for the *interval* which is also required to affect means 12.

Hence when noise or signal amplitude modulation is present in the signal from source 10, means 12 will not be actuated or provide an output.

It should be noted that in the absence of limiting amplifier 18, time-amplitude sensitive device 12 might respond to a modulated carrier such as signal 34, since the average amplitude of waveform 44 is substantially equal to the average amplitude of waveform 26.

As aforenoted, detector 14 may be omitted if time-amplitude sensitive means 12 is a unit which will initiate a control function in response to the average A.C. amplitude of a signal supplied thereto (e.g., an A.C. relay). In this case the function of detector 14 will actually be incorporated in means 12.

LPF 16 is not essential to operability of the invention; its function is merely to provide a smoother signal to improve the operation of the limiter and time-amplitude sensitive means.

*FIG. 2*

DESCRIPTION

The detector system of FIG. 2 is identical to the system of FIG. 1 with the exception that LPF 16 of FIG. 1 is replaced by elements 56, 58, and 60 in FIG. 2. Elements in FIG. 2 corresponding to like elements in FIG. 1 have been identified with like reference numerals.

Element 56 is desirably a dropping impedance which will provide a D.C. voltage drop; element 58 is desirably a high pass filter (HPF), or any other element which will block D.C. signals, such as a capacitor; and element 60 is desirably an amplifier. In lieu of a dropping impedance for element 56 may be used a low pass filter, which does not provide a D.C. voltage drop, but which does block A.C. signals. If a D.C. voltage drop is provided by element 56, amplifier 60 may be omitted; if no D.C. voltage drop is provided by element 56, amplifier 60 is required. If amplifier 60 is used in conjunction with an element 56 which does provide a D.C. voltage drop, a more sensitive detector will be obtained, as will be explained.

It can be seen that the substitution of elements 56, 58, and 60 results in the signal 62, appearing at the output of detector 14, being fed through parallel paths to reach point 64.

More particnlarly, it will be observed that signal 62 appearing at the output of detector 14 has a D.C. component and an A.C. component, similar to wave 42 in FIG. 1. The A.C. component is manifested by peaks 68 and valley 70 in the envelope of the wave and the D.C. component is manifested by the average height of the wave. In order to increase the ratio of peak-to-valley distance to the average height of the wave (and thus provide a more sensitive detector) it will be obvious that the A.C. component of the wave must be increased in amplitude in relation to the average height of the wave. The simplest way to do this is to provide a dropping impedance (such as a resistance) for element 56 and a D.C. block (such as a capacitor) for element 58, with amplifier 60 omitted. The dropping impedance 56 will supply to point 64 a version of wave 62 whose average amplitude is decreased, while D.C. block 58 will supply to point 64 only the A.C. component of wave 62, with its amplitude substantially unaltered. When the two signals are reunited at point 64, a wave 66 will appear in which the ratio of distance from valley 72 to peaks 74 to the average height of the wave is greater than in wave 62. In other words the amplitude interrelationships in wave 66 are expanded vis-a-vis wave 62.

If amplifier 60 is utilized to amplify the A.C. component a further expansion (and hence a more sensitive detector) may be obtained. Also, if element 56 is simply a low pass filter which does not reduce the average amplitude of wave 62 (e.g., a series inductor or shunt capacitor), amplifier 60 is, of course, required in order to provide the necessary relative amplification of the A.C. component of wave 62.

The signal represented by waveform 66 may have to be amplified before being applied to limiting amplifier 18 (or the saturation level of amplifier 18 lowered) due to attenuation in dropping impedance 56. The saturation level of amplifier 18 must, of course, conform to the average level of the signal supplied thereto.

The signal represented by waveform 66 may also be filtered through a low pass filter (not shown in FIG. 2) before application to amplifier 18 if it is desired to apply a smoother signal (similar to waveform 44 in FIG. 1) to amplifier 18.

Waveform 66 is clipped at level 76 by limiting amplifier 18, providing waveform 78 which is fed to time-amplitude sensitive means 12 as before. It will be noted that the valley 80 in waveform 78 is deeper than valley 50 in waveform 52 of FIG. 1. Thus the system of FIG. 2 will be sensitive to smaller noise pulses or weak amplitude modulation.

*FIG. 3*

DESCRIPTION

The embodiment of the invention shown in FIG. 3 is an ultrasonic remote control circuit wherein any of 5 different functions can be selected by the state of an incoming carrier wave. Any one of a first four of the functions are selected by modulating an ultrasonic input carrier with one of four predetermined modulating frequencies. The fifth function is selected by removing all modulation, i.e., supplying the carrier alone to the receiver. The fifth function utilizes the same principle of operation as pure carrier detector system of FIG. 1.

Magnetostrictive transducer 100 receives input ultrasonic energy at carrier frequency, as represented by arrows 102. The carrier frequency signal from the transducer is applied to the base of amplifier transistor 104. Also applied to the base of transistor 104 via line 106 and the transducer pickup coil 108 is a D.C. signal, which performs an automatic gain control (AGC) function on the stage including transistor 104 and which is also recovered after amplification in said stage for output function control purposes. Transistor 104 and its bias circuitry thus comprise a reflex amplifier which amplifies both the carrier frequency signal from transducer 100 and the D.C. signal from lead 106.

The output amplified carrier frequency signal is applied to the base of transistor 110 via capacitor 112, which capacitor blocks the amplified D.C. signal. The amplified D.C. signal is applied to the base of transistor 114 via the circuit including resistors 116 and 118 and shunt capacitor 120, which constitutes a low pass filter to bypass the amplified carrier frequency output signal. The cascaded transistors 110 and 122 are reflex amplifiers which are arranged to amplify both the carrier frequency signal and the audio frequency amplitude modulation components which are present in the carrier frequency signal. As will be explained in more detail presently, the audio frequency modulation signal is applied to the base of transistor 110 via resistor 164. The two signals amplified by the reflex amplifier stage including transistor 110 are applied to the base of transistor 122 via capacitor 192.

The carrier frequency signal amplified by the reflex amplifier including transistor 122 is recovered in tuned transformer circuit 124 and is applied to separate detector circuits 128 and 130. After rectification by diode 150 in detector circuit 128, the carrier is supplied to audio frequency bypass capacitor 152 in the load circuit of diode 150 so that only the D.C. component of the rectified signal is supplied to lead 106. This D.C. component constitutes the AGC/function control signal aforediscussed. The carrier frequency signal derived from transformer circuit 124 is also applied to detector 130 where the audio frequency modulation present in the carrier frequency signal is recovered. The audio frequency signal is fed back to the base of transistor 110 by way of the low pass carrier blocking filter which includes resistor 182 and capacitors 194 and 202. After reflex amplification in the stages including transistors 110 and 122, the audio frequency modulation signal is recovered across emitter resistor 126 and carrier bypass capacitor 200, and is applied to the base of transistor 132 via resistor 170.

The stage including transistor 132 is biased for class B operation so that the modulation signal applied thereto is rectified as well as amplified therein. Armature coil 146 of relay is connected in the collector circuit of transistor 132. The collector of transistor 132 is also connected to the base of transistor 114 via capacitor 134. Coil 146 is shunted by diode 142 and capacitor 144 which aid in the operation of relay 138.

Relay 138 contains 4 resonant reeds whose respective audio frequencies are labeled. The reeds are alternatively actuated by the rectified modulation signal applied to coil 146. Since the signal supplied to coil 146 has a D.C. component, each reed will touch its associated contact without vibrating for the duration of the modulation signal applied said coil; thus relay 138 will be referred to hereinafter as a "latching" relay. When a particular reed closes, a circuit is completed and energy is supplied by source 148 to one of the first four function units A to D.

The fifth function unit, unit E, is similarly controlled by relay 140 which is in the collector circuit transistor 114. The pull-in current of relay 140 must correspond to the collector of transistor 114 when saturated. Operation of transistor 114 is controlled by both of the signals (D.C.+rectified modulation) which are applied to its base.

OPERATION

Two modes of operation are found in conjunction with the remote control receiver of FIG. 3: one wherein modulation is present in the incoming carrier and relay 138 (Functions A, B, C, or D) is activated, and the other wherein a pure carrier is received and relay 140 (Function E) is activated. These modes will be separately discussed.

1. *Modulation present.*—Assume that a pulse of ultrasonic energy, represented by arrows 102 and consisting of a 40 kc. carrier modulated by a 115, 75, 95, or 135 cycle audio tone, is applied to magnetostrictive transducer 100. Transducer 100 transforms said energy into an electrical signal and applies it to the gain-controlled amplifier stage including transistor 104. The amplified and level-regulated carrier frequency signal is obtained at the collector of transistor 104 and applied in turn to transistors 110, and 122 where it undergoes further amplifications in conventional cascade fashion.

The modulated carrier is recovered in tuned transformer 124 in the collector circuit of transistor 122 and is applied to audio detector 130. There it is rectified and filtered (demodulated) by diode 156, resistor 182 and capacitors 194–202, respectively, where a modulation signal of audio frequency is obtained and fed back to the base of transistor 110.

This audio frequency signal, after amplification along with the carrier frequency signal in the cascade reflex amplifiers including transistors 110 and 122, is recovered and applied alone to the base of transistor 132.

The rectified and amplified audio or modulation signal present in collector circuit of the amplifier including transistor 132, flows through the armature coil 146 in relay 138.

One of the resonant reeds in relay 138 responds to the flux from coil 146, according to which of the four frequencies, 115, 75, 95, or 135 cycles the audio consists, and the particular reed makes contact with its associated terminal for the duration of the pulse. The source 148 of electrical energy, e.g., 120 volts as shown, will supply current through the particular reed which is making contact to energize the associated one of the first 4 of the function units A to D, after which the current is returned to source 148.

The modulated carrier is also supplied from tuned transformer circuit 124 in the collector of transistor 122 to D.C. detector 128 where it undergoes rectification by diode 150 and filtering by capacitor 152. An AGC/function control pulse is produced on line 106 which is applied to the base of transistor 104 via coil 108 of transducer 100. The pulse controls the gain of and is amplified in the reflex amplifier including transistor 104 along with the incoming ultrasonic A.C. carrier, and the amplified D.C. pulse alone is applied via resistor 118 to the base of transistor 114, the amplified A.C. carrier being filtered out by capacitor 120 as discussed.

2. *Pure carrier present.*—If the incoming ultrasonic energy 102 consists of a pure carrier, the operation of the FIG. 3 circuit is similar to its operation when a modulated carrier was received, with the following exceptions. No audio signal is fed to coil 146 of relay 138 or to capacitor 134 from transistor 132 since none is present in the carrier to be demodulated by detector 130. The only signal applied to the base of transistor 114 will be the D.C. pulse aforenoted. This will saturate transistor 114 for a sufficient interval to close relay 140 and enable source 148 to supply current through the switch 150 in relay 140 for activation of function unit E.

Other components in the circuit have conventional functions and will not be discussed other than to briefly note that resistors 152 and 154 are stabilizing resistors which produce degeneration in the stages which include transistors 104 and 110.

STEREO CONTROL APPLICATION

The circuit of FIG. 3 was successfully used to perform remote control operations on a stereo amplifier. Components having the following values (which are exemplary only and which are not to be considered limiting) were used:

*Semiconductors*

| | |
|---|---|
| Transistors 104, 110, 122, 132, 114 | 2N224 |
| Diodes 150, 156 | 1N60 |

*Resistors*

| | |
|---|---|
| 152, 154 | 270K |
| 158, 160, 162, 164 | 4.7K |
| 166 | 39 |
| 168 | 1200 |
| 126 | 2.2K |
| 170 | 220 |
| 172 | 0–50 |
| 174 | 0–100 |
| 176 | 100 |
| 116, 178, 180 | 10K |
| 118 | 12K |
| 182 | 1K |
| 184 | 180 |
| 186 | 5.6K |
| 188 | 47K |

*Capacitors*

| | | |
|---|---|---|
| 190 | μf. | 3 |
| 120, 192 | μf. | 2 |
| 112, 194, 152 | μf. | .01 |
| 196 | μf. | 100 |
| 198 | μf. | 8200 |
| 200, 202 | μf. | .1 |
| 204 | μf. | 500 |
| 144 | μf. | 3 |
| 134 | μf. | .047 |

*Miscellaneous*

| | | |
|---|---|---|
| Relay 140, operate power | mw. | 75 |
| Latching reed relay 138, frequencies | cycles. | 135, 95, 75, and 115 |
| B supply | v. | —18 |
| Carrier frequency | kc. | 39.375 |
| Function A | | Balance left |
| Function B | | Volume down |
| Function C | | Balance right |
| Function D | | Volume up |
| Function E | | Reverb. |

The remote control receiver of FIG. 3 has excellent noise immunity. Relay 140 is inherently immune to noise because it and its driving circuitry are similar to the pure carrier detector or noise immunity circuit of FIG. 1. Relay 138 is substantially immune to noise because it can only be actuated if ultrasonic energy of a particular frequency (i.e., that of tuned transformer circuit 124) which is amplitude modulated by one of four predetermined modulating frequencies (i.e., the frequencies of the 4 resonant reeds) is supplied to transducer 100; noise will rarely consist of this type of energy.

The instant invention is not limited to the specificities of the above descriptions since many modifications thereof which still fall within the true scope of the inventive concept will be apparent to those conversant with the art. The invention is defined only by the appended claims.

I claim:

1. A highly sensitive noise and modulation detector comprising:

(a) a source of alternating signal,
(b) a signal detector for deriving a rectified signal from said alternating signal,
(c) means for isolating the alternating current component from said rectified signal,
(d) means for amplifying the said alternating current component,
(e) means for combining the amplified alternating current component with said rectified signal to provide a resulting signal,
(f) limiting means for reproducing amplitude variations of said resulting signal up to a predetermined level and supplying a substantially constant level output when the amplitude of said resulting signal exceeds said predetermined level,
(g) means for initiating a control function when the output signal of said limiting means equals said substantially constant output for a predetermined interval.

2. The detector of claim 1 wherein said means recited in clause (g) is a relay.

3. A noise immune remote control receiver for initiating at least a first control function when a received carrier signal is amplitude modulated by a modulating signal and a second control function when said received carrier signal is not amplitude modulated, comprising:

(a) means for deriving said modulating signal, when present, from said carrier,
(b) means responsive to said derived modulating signal for initiating said first control function,
(c) means for rectifying and filtering said carrier to derive a direct current control signal, (d) means for combining said direct current control signal with said derived modulating signal, when present, to produce a resultant signal, (e) limiting means for reproducing the variations in said resultant signal for values thereof below a predetermined amplitude and for producing a substantially constant output when the amplitude of said resultant signal assumes values equal to or above said predetermined amplitude, and (f) means for initiating a control function only if the output of said limiting means equals said substantially constant output for a predetermined interval.

4. The receiver of claim 3 wherein said limiting means is a transistor which saturates when said resultant signal reaches said predetermined amplitude, and said means recited in clause (f) is a relay.

5. The receiver of claim 3 wherein means are provided to amplify said carrier before said modulating signal is separated therefrom, and said amplifying means is also used to amplify said control signal.

References Cited by the Examiner

UNITED STATES PATENTS

| | | | |
|---|---|---|---|
| 2,533,803 | 12/1950 | Hings | 329—179 |
| 2,996,681 | 8/1961 | Marks | 325—487 |
| 3,037,170 | 5/1962 | Good et al. | 328—165 |
| 3,098,936 | 7/1963 | Isabeau | 328—169 |
| 3,127,563 | 3/1964 | Paulson | 325—466 |
| 3,138,756 | 6/1964 | Tarantar | 325—486 |
| 3,192,507 | 6/1965 | Sadges | 343—225 X |
| 3,199,070 | 9/1965 | Baier | 325—37 |

DAVID G. REDINBAUGH, *Primary Examiner.*

STEPHEN W. CAPELLI, *Examiner.*

B. V. SAFOUREK, *Assistant Examiner.*